(12) United States Patent
Liu

(10) Patent No.: US 7,076,407 B2
(45) Date of Patent: Jul. 11, 2006

(54) SPACE REDUCTION IN COMPOSITIONAL STATE SYSTEMS

(76) Inventor: Wayne Biao Liu, 403-25 Roehampton Ave., Toronto, Ontario (CA) M4P 1P9

( * ) Notice: Subject to any disclaimer, the term of this patent is extended or adjusted under 35 U.S.C. 154(b) by 756 days.

(21) Appl. No.: 09/938,708

(22) Filed: Aug. 24, 2001

(65) Prior Publication Data

US 2003/0158720 A1    Aug. 21, 2003

(51) Int. Cl.
*G06F 17/50*    (2006.01)
*G06F 9/44*    (2006.01)

(52) U.S. Cl. ............ 703/2; 703/16; 716/2; 716/5; 714/37

(58) Field of Classification Search ........ 703/2, 703/13–22; 716/1–4, 5; 714/37
See application file for complete search history.

(56) References Cited

U.S. PATENT DOCUMENTS

| 5,537,580 | A   |   | 7/1996  | Giomi et al.     |        |
|-----------|-----|---|---------|------------------|--------|
| 5,615,137 | A   | * | 3/1997  | Holzmann et al.  | 703/17 |
| 6,192,505 | B1  |   | 2/2001  | Beer et al.      |        |
| 6,212,669 | B1  |   | 4/2001  | Jain             |        |
| 6,643,827 | B1  | * | 11/2003 | Yang             | 716/2  |
| 6,715,107 | B1  | * | 3/2004  | Beer et al.      | 714/37 |

FOREIGN PATENT DOCUMENTS

WO    WO 99/50746    10/1999

OTHER PUBLICATIONS

Christensen et al, "Modular Analysis of Petri Nets," Computer Journal, vol. 43 No. 3, pp. 224-242 (2000).*
Hou et al, "Model Reductions in MDG-Based Model Checking," IEEE Proceedings of the 13th Annual International ASIC/SOC Conference, pp. 347-351 (Sep. 2000).*
Lee et al, "Ordering Method for Reducing State Space in Compositional Verification," 1999 IEEE International Conference on Systems, Man, and Cybernetics, vol. 1, pp. 806-811 (Oct. 1999).*
Baumgartner et al, "An Overview and Application of Model Reduction Techniques in Formal Verification," 1998 IEEE International Conference on Performance, Computing and Communications, pp. 165-171 (Feb. 1998).*
Holzmann, Gerald J., "The Model Checker Spin", IEEE Transactions on Software Engineering, vol. 23, No. 5, May 1997, pp. 1-17.

(Continued)

*Primary Examiner*—Thai Phan
(74) *Attorney, Agent, or Firm*—Beyer Weaver & Thomas LLP

(57) ABSTRACT

Models in compositional state systems are reduced by defining a set of events of interest and defining a transitive effect machine for components in the model relative to the events of interest. A transitive effect machine for a given component is defined by determining the transitive effects of events in the given component on other components in the model. Transitive effect machines are defined relative to reduced versions of other components in the model. The transitive effect machines are defined by successive assumptions of the reduced versions of the other components in the model and successively defined approximations to the transitive effect machine.

36 Claims, 7 Drawing Sheets

OTHER PUBLICATIONS

Norris, et al., "Better Verification Through Symmetry", Department of Computer Science, Stanford University, To appear in Formal Methods in System Design, vol. 9, Nos. 1/2, 1996, pp. 1-34.

Burch, et al., "Symbolic Model Checking: $10^{20}$ States and Beyond", School of Computer Science Carnegie Mellon University, Stanford University, Jun. 1990, pp. 1-33.

Graf, et al., "Compositional Minimization of Finite State Systems", In Proc 2nd Workshop on Computer Aided Verification, vol. 531 of Lecture Notes in Computer Science, Rutgers, Jun. 1990, pp. 1-21.

Godefroid, et al., "A Partial Approach to Model Checking", Information and Computation, vol. 119, No. 2, Academic Press, May 1994, pp. 1-21.

Cheung, et al., "Incorporation of Context Constraints for Compositional Reachability Analysis", Technical Report HKUST-CS96-5, Department of Computer Science, The Hong Kong University of Science and Technology, Feb. 1996, pp. 1-40.

Liu, Wayne, "Interaction Abstraction for Compositional Finite State Systems", Department of Electrical and Computer Engineering, Proceedings of the 7th SPIN Workshop, University of Waterloo, vol. 1885, Sep. 2000, pp. 148-162.

Holzmann et al., "A Practical Method of Verifying Event-Driven Software", Proc Int Conf on Software Engineering, ICSE99, Los Angeles, May 1999, pp. 597-608.

P. Godefroid, "Using Partial Orders to Tackle State Explosion", LNCS 1032, Springer-Verlag 1996, Extract: Chapters 3, 4, 5, pp. 27-79.

R. Milner, "Bisimulation and Observation Equivalence", Communication and Concurrency, Prentice-Hall 1989, Extracts: Chapter 5 and Section 9.4, pp. 106-127.

* cited by examiner

Classification:
[6] = [7]

SPACE REDUCTION IN COMPOSITIONAL STATE SYSTEMS

FIELD OF THE INVENTION

The present invention is directed to an improvement in the analysis of computing systems and in particular to an improvement in reducing the state space of compositional state systems.

BACKGROUND OF THE INVENTION

It is often desirable to analyze complex systems such as telephone systems, computer networks, and integrated circuits. In the prior art, computer systems have been developed which use state machine models to represent such complex systems and their behaviour. A model is a collection or system of state machines. Computer systems which support the definition and manipulation of such models permit the analysis of the modelled systems. Three examples of the types of analysis that are made possible by such modelling computer systems are verification (including model checking and equivalence checking), test generation, and synthesis. In verification analysis, a computer system permits a model to be created and analyzed to ensure that the modelled system will function correctly. Test generation analysis derives test cases from the model to test the correctness of the system modelled. A computer system may also support functions to permit a model to be defined to represent a system yet to be created. Such models are used, for example, to generate computer software code, or an integrated circuit design. This is a synthesis analysis of the model.

A well-known approach to formally representing a system is for a modelling computer system to use a state machine for model representation. State machine models are used for verification analysis. For example, the SPIN model checker has been used to find errors in the software of a telephone exchange. The computer software code of critical parts of the telephone system was translated to the Promela modelling language. The SPIN model checker analyzed the state machine model as given by the Promela description, and checked for violation of properties that indicates an error in the program (G. J. Holzmann, The model checker SPIN, IEEE Trans on Software Engineering, V 23 N 5 pp 279–295, May 1997; G. J. Holzmann, and M. H. Smith, A practical method for the verification of event driven systems, Proc Int Conf on Software Engineering, ICSE99, Los Angeles pp 597–608, May 1999).

Computer systems that support state machine models may also be used for synthesis. U.S. Pat. No. 5,537,580, Integrated Circuit Fabrication Using State Machine Extraction from Behavioural HDL describes the design of an integrated circuit using a state machine model.

A state machine is defined to have a number of states and transitions (or events). The model represents a system state as a node in the state machine and a system event as a directed edge between nodes. Thus one node at the end of an edge will represent the system state before the event, and the other node will represent the system after the event has occurred.

For complex systems, a model will not have a single large state machine representation but will be defined by a number of components, reflecting the structure of the system. Each component may itself be a model or may be a state machine. Components within such a model have defined interactions. An interaction between two components will cause a state change that is represented in both components.

Computer systems which support analysis carried out on state machine models are subject to the state explosion problem. This occurs when the analysis computes the composition of the model. If there are M components in a model and each component has N states the system, when fully expanded as a result of computing the composition of the system, has N to the exponent M states. For complex systems, computing the fully expanded composition of the system therefore requires significant computing resources.

In the prior art, techniques have been developed to speed up analysis. Many prior art techniques for the analysis of hardware systems use binary decision diagrams (BDDs; J. R. Burch, E. M. Clarke, K. L. McMillan, D. L. Dill, and L. H. Hwang. Symbolic Model Checking: 1020 States and Beyond. In Proc. of the 5th Annual IEEE Symposium on Logic in Computer Science, pages 428–439, 1990). BDDs represent certain state machines very compactly, and in certain cases efficient analysis of the state machine may be carried out when the model is represented by a BDD.

Other prior art techniques are used to improve the efficiency in the state machine analysis by avoiding redundant computations. For example, the SPIN model checker performs on-the-fly model checking. In this approach the system expands the composition of state machines at the same time it performs the state machine analysis. Thus, if the desired result of the analysis is obtained by expanding only a part of the system, the expansion of the entire system is avoided. Further techniques to avoid redundant computations are partial order reduction and symmetry reduction. (P. Godefroid. Partial-Order Methods for the Verification of Concurrent Systems, An Approach to the State-Explosion Problem. LNCS 1032, Springer-Verlag 1996). (Norris Ip and David L. Dill. Better Verification through Symmetry. Formal Methods in System Design, Volume 9, Numbers 1/2, pp 41–75, August 1996)

A third approach is to reduce the size of models prior to analysis. For example, some techniques remove identified redundant elements (U.S. Pat. No. 6,192,505: Method and System for Reducing State Space Variables Prior To Symbolic Model Checking).

The most powerful technique for reducing models is equivalence reduction. This technique replaces the state machine model with the smallest state machine model that has the same properties. Equivalence reductions will yield smaller models than techniques that remove specific redundant elements. Different equivalence relations have been defined, which specify what type of properties must be preserved. For example, observation equivalence is a popular equivalence relation, which allows large amounts of model reduction and has efficient algorithms to compute the reductions (R. Milner. Communication and Concurrency. Prentice-Hall 1989).

However, equivalence reduction alone is often not a practical reduction technique as it depends on expanding the composition. For this reason, other equivalence reduction techniques have been developed. One such prior art technique is compositional minimization. This is a technique that performs equivalence reduction on each component in a compositional state system. After the equivalence reduction has taken place, the system expands the composition of a subset of reduced components, and performs equivalence reduction on the expanded subset, and so on. The system is initially simplified by the expansion of a subset of the reduced components rather on the entire state system. However, compositional minimization is often ineffective since it requires subsets of components to be composed, which results in state explosion. Moreover, it does not use information about interactions of the subset with the rest of the components, so that the expanded state machine model of the subset can be larger than the expanded model of all the components.

Several techniques allow using information about interactions with other components to alleviate the problem of expansion of subsets being larger than the expansion of the whole system. These include the replacement of other components in the model, other than the component of interest, with simple state machines that are defined to have interactions with the component of interest which are supersets of the actual interactions in the model. Another approach is for a system user to provide input to the system to define reductions in the model. However, this approach gives rise to potential errors by the user and is often time consuming and difficult to carry out (S. C. Cheung and J. Kramer. Context Constraints for Compositional Reachability Analysis. ACM Transactions on Software Engineering and Methodology. October 1996; B. Steffen, S. Graf, G. Lüttgen "Compositional Minimization of Finite State Systems". International Journal on Formal Aspects of Computing, Vol. 8, pp. 607–616, 1996).

Further drawbacks to these techniques are that they require the compositional state system to be expanded, and that the techniques cannot be effectively used in conjunction with techniques that avoid redundant computation.

It is therefore desirable to implement a method and system for reducing compositional state models to a reduced state space where it is possible to avoid having to fully expand the composition of the components in the model.

SUMMARY OF THE INVENTION

According to an aspect of the present invention there is provided an improved method and system for reducing the state space of compositional state systems.

According to another aspect of the present invention there is provided a method for generating a reduced state space representation for a model in a compositional state system, the model including a selected set of components, each component including one or more states and one or more events, the model including interactions associated with events, the reduced state space representation being defined with respect to a set of events of interest selected from the events in the set of components the method including the following steps:

for each component in the set of components, defining a transitive effect machine for the component such that the states of the transitive effect machine represent the states of the component and the events of the transitive effect machine represent the transitive effects of interactions associated with transitions of the component, the transitive effects being defined relative to the set of components, and the set of events of interest, and reducing each of the defined transitive effect machines, the reduction including the classification of states within a single transitive effect machine to permit a set of states in the transitive effect machine to be grouped into a single class when each state in the set of states is characterized by common properties with respect to the set of events of interest.

According to another aspect of the present invention there is provided the above method in which the compositional state system supports labelled transition system models.

According to another aspect of the present invention there is provided the above method in which equivalent effects of transitive interactions for the transitions in the set of components are defined relative to a one of bisimulation or simulation equivalence.

According to another aspect of the present invention there is provided the above method in which equivalent effects of transitive interactions for the transitions in the set of components are defined relative to a one of observational equivalence or safety equivalence.

According to another aspect of the present invention there is provided the above method in which the transitive effect machines are represented by BDDs.

According to another aspect of the present invention there is provided the above method including the further step of carrying out an expanding composition of the reduced state representation defined by the set of reduced transitive effect machines.

According to another aspect of the present invention there is provided the above method including the further step of converting the reduced state representations to a labelled transition system representation.

According to another aspect of the present invention there is provided a method for generation of a reduced state space representation of a model in a compositional state system, the model including a set of components, each component including one or more states and one or more events, the model including interactions associated with events, the reduced state space representation being defined with respect to a set of events of interest selected from the events in the set of components, the method including the successive generation of a set of reduced transitive effect machines relative to a set of successively defined assumed reduced components, each one of the reduced transitive effect machines including classes and events and uniquely corresponding to a component in the set of components and each one of the assumed reduced components uniquely corresponding to a reduced transitive effect machine and being derived from the corresponding component in the set of components and including a set of classes into which the states in the component are grouped.

According to another aspect of the present invention there is provided the above method in which the generation of each reduced transitive effect machine includes the steps of generating an intermediate transitive effect machine including states and events, the states of the intermediate transitive effect machine representing states of the component uniquely corresponding to the reduced transitive effect machine and the events of the intermediate transitive effect machine representing one or more sets of equivalent effects of transitive interactions, the equivalent effects of transitive interactions being defined for a pair of states in the component uniquely corresponding to the reduced transitive effect machine, the defined equivalent effects being determined with reference to the set of successively defined assumed reduced components, where equivalent effects represent the transitive effects of interactions associated with each of the pair of states, on a selected number of assumed reduction components, the transitive effects being defined with respect to the set of events of interest, and generating the reduced transitive effect machine by reducing the states in the intermediate transitive effect machine to classes of states to define the classes in the reduced transitive effect machine and by reducing the events in the intermediate transitive effect machine to define the events in the reduced transitive effect machine.

According to another aspect of the present invention there is provided the above method in which each defined assumed reduction component is initialized to a defined condition and in which the successive definitions of the assumed reduction component are derived from the corresponding reduced transitive effect machine.

According to another aspect of the present invention there is provided the above method in which a single step in the successive generation of reduced transitive effect machines is terminated, and a further successive generation step is commenced, where the classes of a reduced transitive effect machine defined in the single successive generation step are not consistent with the classes in the corresponding assumed reduction component.

According to another aspect of the present invention there is provided the above method in which the initialization of each assumed reduced component includes the step of defining each class in the assumed reduced component to include all states in the corresponding component in the state of components.

According to another aspect of the present invention there is provided the above method in which each step in the successive redefinition of the assumed reduced components includes defining the classes in each assumed reduced component to be equivalent to the classes in the previously generated corresponding reduced transitive effect machine.

According to another aspect of the present invention there is provided the above method in which the equivalent effects of transitive interactions for each transition in a component are defined with respect to each of the non-corresponding assumed reduced components.

According to another aspect of the present invention there is provided the above method in which the equivalent effects of transitive interactions for each transition in the component are defined with respect to defined subsets of the non-corresponding assumed reduced condition.

According to another aspect of the present invention there is provided the above method in which the equivalent effects of transitive interactions for the corresponding component are merged prior to defining each intermediate reduced transitive effects machine.

According to another aspect of the present invention there is provided the above method in which the order of generation of intermediate reduced transitive effect machines is arranged in one or more of the following ways
  a. the generation of intermediate transitive effect machines uses the assumed reduced component corresponding to the most recently defined reduced transitive effect machines;
  b. a sequential selection of assumed reduced components for use in determining equivalent effects is arranged from the assumed reduced component with fewest classes to the assumed reduced component with most classes; and
  c. the generation of defined sets of intermediate reduced transitive effect machines is carried out in parallel.

According to another aspect of the present invention there is provided a method for generating a test sequence for a system, the system being represented by a model having states and events, the method including the following steps:
  a. composing the model and a test representation to generate a composed test model, the test representation including states and events defining a set of test requirements, and including one or more acceptance events,
  b. defining a set of transitive effect machines by carrying out the above method or with respect to the composed test model and a set of events of interest, the set of events of interest including one or more of the acceptance events,
  c. defining an input data set for a test sequence generator using the set of transitive effect machines, and
  d. obtaining the test sequence by running the test sequence generator on the input data set.

According to another aspect of the present invention there is provided a method for generating a test sequence for a system, the system being represented by a model having states and events, the method including the following steps:
  a. defining a set of events of interest,
  b. composing the model and a test representation to generate a first composed test model, the test representation including states and events defining a set of test requirements, and including one or more acceptance events,
  c. defining successive sets of transitive effect machines by carrying out the above method or with respect to successively defined composed test models and successively defined subsets of the set of events of interest, the subset including one or more of the acceptance events, the successive definition of composed test models including the composition of the first test model with the output of a previously defined interim test sequence,
  d. defining input data sets for a test sequence generator using the successive sets of transitive effect machines,
  e. obtaining a series of interim test sequences by running the test sequence generator on the input data sets, and
  f. defining the test sequence by running the test sequence generator on the series of interim test sequences.

According to another aspect of the present invention there is provided a computer program product comprising a computer usable medium tangibly embodying computer readable program code for carrying out the above methods.

According to another aspect of the present invention there is provided a computer system for generating a reduced state space representation for a compositional state model, the model comprising a selected set of components, each component comprising one or more states and one or more events, the model comprising interactions associated with events, the reduced state space representation being defined with respect to a set of events of interest selected from the events in the set of components, the computer system including:
  a. program code for defining, for each component in the set of components, a transitive effect machine for the component such that the states of the transitive effect machine represent the states of the component and the events of the transitive effect machine represent the transitive effects of interactions associated with transitions of the component, the transitive effects being defined relative to the set of components, and the set of events of interest, and
  b. program code for reducing each of the defined transitive effect machines, the reduction including the classification of states within a single transitive effect machine to permit a set of states in the said transitive effect machine to be grouped into a single class when each state in the said set of states is characterized by common properties with respect to the set of events of interest.

According to another aspect of the present invention there is provided the above computer system, further including program code for carrying out an expanding composition of the reduced state representation defined by the set of reduced transitive effect machines.

According to another aspect of the present invention there is provided a computer system for generation of a reduced state space representation of a model, the model including a set of components, each component including one or more states and one or more events, the model including interactions associated with events, the reduced state space representation being defined with respect to a set of events of interest selected from the events in the set of components, the computer system including program code the successive generation of a set of reduced transitive effect machines relative to a set of successively defined assumed reduced components, each one of the reduced transitive effect machines including classes and events and uniquely corresponding to a component in the set of components and each one of the assumed reduced components uniquely corresponding to a reduced transitive effect machine and being derived from the corresponding component in the set of components and including a set of classes into which the states in the component are grouped.

According to another aspect of the present invention there is provided the above computer system in which the program code for generation of each reduced transitive effect machine includes:
  program code for generating an intermediate transitive effect machine including states and events, the states of the intermediate transitive effect machine representing states of the component uniquely corresponding to the reduced transitive effect machine and the events of the intermediate transitive effect machine representing one or more sets of equivalent effects of transitive interactions,
  the equivalent effects of transitive interactions being defined for a pair of states in the component uniquely corresponding to the reduced transitive effect machine, the defined equivalent effects being determined with reference to the set of successively defined assumed reduced components, where equivalent effects represent the transitive effects of interactions associated with each of the pair of states, on a selected number of assumed reduction components, the transitive effects being defined with respect to the set of events of interest, and
  program code for generating the reduced transitive effect machine by reducing the states in the intermediate transitive effect machine to classes of states to define the classes in the reduced transitive effect machine and by reducing the events in the intermediate transitive effect machine to define the events in the reduced transitive effect machine.

Advantages of the present invention include a method and system that permits less costly analysis for a defined set of events and properties in a compositional state system without requiring the computation of the composition of the entire system.

BRIEF DESCRIPTION OF THE DRAWINGS

In drawings which illustrate by way of example only a preferred embodiment of the invention.

FIG. 8 is a state diagram showing the transitive effects machine produced in accordance with the preferred embodiment for the display component of FIG. 1.

FIG. 9 is a state diagram showing the reduced transitive effects machine that may be produced in accordance with the preferred embodiment for the display component of FIG. 1.

DETAILED DESCRIPTION OF THE INVENTION

The preferred embodiment of the invention relates to a computer system for carrying out a method for the reduced composition of state spaces. There are different approaches known in the art for representing state spaces or state machines. It is convenient to describe the preferred embodiment with reference to one prior art approach to state machines, the labelled transition system ("LTS").

The LTS models and related data structures of the preferred embodiment may be implemented by different computer hardware and software, known in the art. As is referred to below, the preferred embodiment may also be implemented using compositional state systems that utilize representations other than the LTS approach. For example, computer systems which support the representation of systems using Extended Finite State Machines (EFSMs), State/Event Systems, Petri-Nets, process algebras, other algebraic or diagrammatic, and appropriate systems are also available to carry out property-preserving reductions in compositional state systems.

Figure 1:
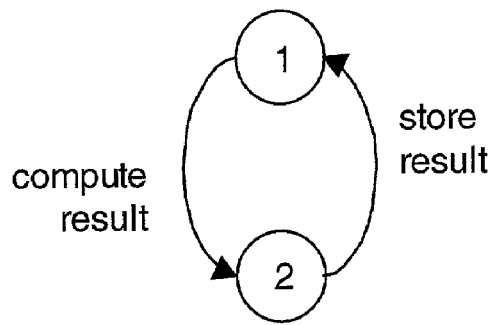
FIGS. 1, 2, and 3 are each a compositional state diagram and collectively represent an example model that may be reduced in accordance with the preferred embodiment.
Figure 2:
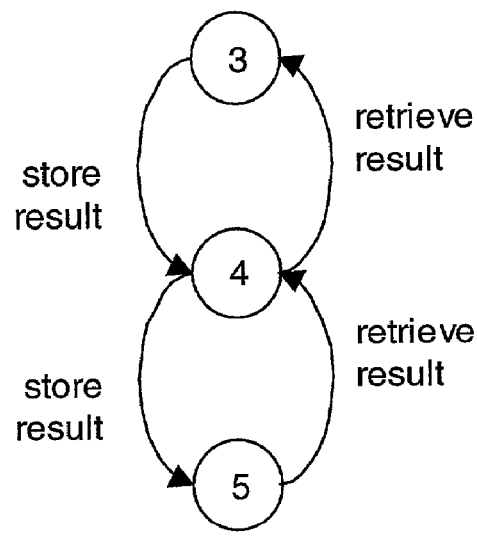
Figure 3:
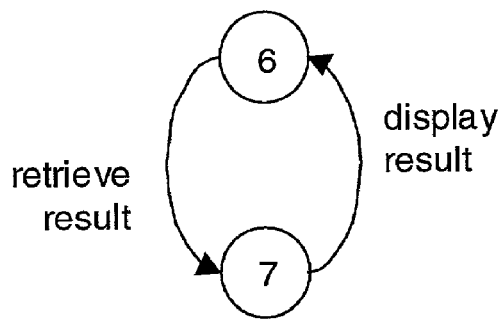

An LTS representation of an example model in a compositional state system is illustrated in FIGS. 1 to 3. The directed graphs in FIGS. 1 to 3 each represent a component in the model represented by the modelling system. In an LTS, a transition in a state machine is defined as a label on a directed edge, and a state by a node in the directed graph. An interaction between two components within an LTS model is defined to occur where edges in both components of the model have the same label. In such a case, the event represented by the edge will cause a state change that is represented in both components.

In the approach of the preferred embodiment, a set of edge labels is defined to be of interest in the model of interest. The system implementing the method of the preferred embodiment then permits the components in the model to be reduced in a way that ensures that the model remains correct, insofar as the edge labels (events) of interest are concerned, but permits the model to be reduced to a size smaller than the original representation. In other words, the preferred embodiment permits a reduction in the space of the originally defined model, for the defined set of edge labels (or events). In the preferred embodiment, the reduced space is arrived at by defining classes of states which consist of states which have the same properties of interest (i.e. are equivalent) with respect to the events of interest. It is often advantageous to define the events of interest to be as small a set as possible (in some cases, as described in more detail below, it is possible to subdivide the set of events of interest to achieve greater efficiencies in system operation).

FIG. 1 is a directed graph having nodes 1, 2. Each directed edge between the nodes is labelled ("complete result" and "store result"). Similarly, FIG. 2 is a directed graph having nodes 3, 4, 5 and labelled directed edges between nodes 3, 4, 5 ("store result" and "retrieve result"). FIG. 3 is a directed graph having nodes 6, 7 and labelled directed edges ("retrieve result" and "display result"). As may be seen, in the example of FIGS. 1, 2, 3, nodes represent system states and edges represent events.

FIGS. 1, 2, and 3 represent a simple computer system: FIG. 1 represents a computation component which computes a result and sends it through a communication component to a display component. FIG. 2 represents a communication component, which transports results from the computation component to the display component. FIG. 3 represents a display component, which retrieves results from the communication component and displays the result in a user-friendly way.

To allow for the computation and display components to operate at different speeds, the communication component can store up to two results in a buffer. This is shown in the model of FIG. 2 by directed edges labelled "store result" from states 3 to 4 and from states 4 to 5. If two results have been stored without any being retrieved, the computation component must wait before storing another result. This limitation is shown in the model as a lack of a directed edge labelled "store result" with a starting point in state 5. Thus, there is no possible "store result" interaction when the communication component is in state 5. Similarly, if the display component has retrieved all results sent, it must wait for another result to be stored before it can proceed.

In FIGS. 1, 2, 3 a simple LTS representation of a computer system is shown. The preferred embodiment provides a computer system for representing the LTS model of FIGS. 1, 2, 3. The modelling system is defined in a manner known to those skilled in the art to permit the definition and manipulation of state machines such as the LTS model shown in the example of FIGS. 1, 2, 3.

Figure 4:
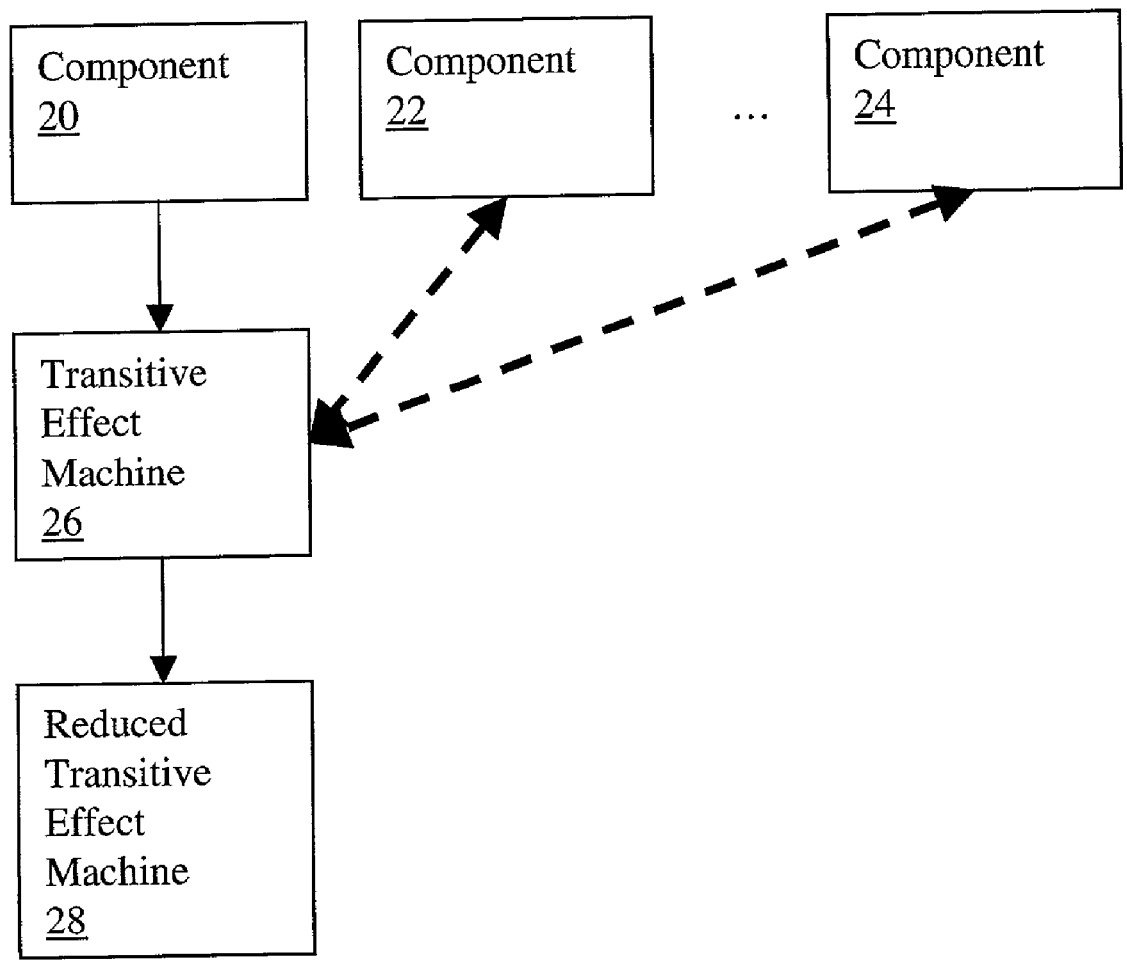
FIG. 4 is a block diagram showing at a high-level the steps of the reduction of an example in accordance with the preferred embodiment.

According to the preferred embodiment, the modelling computer system supports the generation of representation of a transitive effect machine for each component in a defined set of components in the state machine system. The defined set of components may be the entire set of components in the model, or may be a subset. FIG. 4 is a block diagram showing by way of example a model having components 20, 22, 24 (which may correspond to the components shown in FIGS. 1, 2, 3).

Transitive effect machine 26 is generated by the system of the preferred embodiment and is shown to be associated with component 20. Transitive effect machine 26 is initially defined to have states derived from component 20. The edges in transitive effect machine 26, however, are replaced with edges representing the transitive effects of interactions in component 20 (the occurrence of events of interest are preserved in the edges). The transitive effects are defined with respect to components 22, 24 in the set of components (as suggested by the dashed arrows in FIG. 4). This generated data structure (transitive effect machine 26 for component 20) is, itself, a type of state machine. Once the transitive effect machines representing the other components in the set of components in the original state machine are generated (not shown in FIG. 4), it is possible to carry out an equivalence reduction on each of the transitive effect machines to obtain reduced transitive effect machines for the components in the set of components. This is shown, for component 20, in the illustrative example of FIG. 4 by reduced transitive effect machine 28.

This reduced transitive effect machine is itself a reduced state space representation of the original component in the model. In the example of FIG. 4, reduced transitive effect machine 28 represents a reduced state space corresponding to component 20. Reduced transitive effect machine 28 will include classes of states derived from component 20. The reduced state space of reduced transitive effect machine 28 will be equivalent to the space of component 20, with reference to the events of interest, as previously defined.

Thus the system of the preferred embodiment provides a reduced space representation of the components of the originally defined model, which is equivalent to the original component, with respect to the defined events of interest. These reduced transitive effect machines may be represented using an LTS or similar representation and used as input for defined model analysis systems. The reduced transitive effect machines may themselves be expanded in a composition of the system. The resulting expanded composition will alleviate the state explosion problem as components being expanded in the full composition are reduced versions of the original components.

As will be appreciated, in the operation of the system of the preferred embodiment as described above, the generation of the edges representing the effects of the original events (including transitive effects) is such that a large number of edges may potentially be generated. However, the set of possible interactions in a model is frequently regular and it is therefore possible to represent such data in an efficient manner. For example, binary decision diagrams (BDDs) may be used to represent transitive effect machines defined in the system of the preferred embodiment. It is known in the art to use BDDs to efficiently represent transitions of state machines as a pair of origin and destination states for each event. The interactions and effects can similarly be defined as a pair of origin and destination states for components, and therefore the generated machines of the preferred embodiment may be efficiently represented using BDDs.

Alternatively, and as described in more detail below, it is also possible to generate only a subset of the transitive effects for a set of components in a compositional state system. Such a reduced state space will be potentially more efficient to define but will not necessarily provide the optimal reduction due to the limitation placed on the numbers of transitive effects generated. Optimization may be carried out for a defined state space and a desired equivalence reduction to determine whether a full set of transitive effect machines is required or whether a subset will be more desirable, given the resources available to the system for generation and storage of the various data structures required to represent the machines generated in the reduction.

The above description relates to the generation of transitive effect machines that show the transitive effects as they relate to the set of components in the system as they are originally defined. However, each such originally defined component may, itself, be capable of representation in an equivalent reduced state space. A transitive effect machine for a component is therefore potentially more useful when the transitive effect machine includes effects on reduced components in the state space, rather than the effects on the set of components in the system as they are originally defined. These effects on reduced components are called equivalent effects.

The preferred embodiment includes a mechanism for defining transitive effect machines using equivalent effects. This approach is based on the successive refinement of intermediate transitive effect machines for the selected components in the model of the compositional state system. The approach also includes the successive refinement of assumed reductions of the originally defined components of the model.

Figure 5:
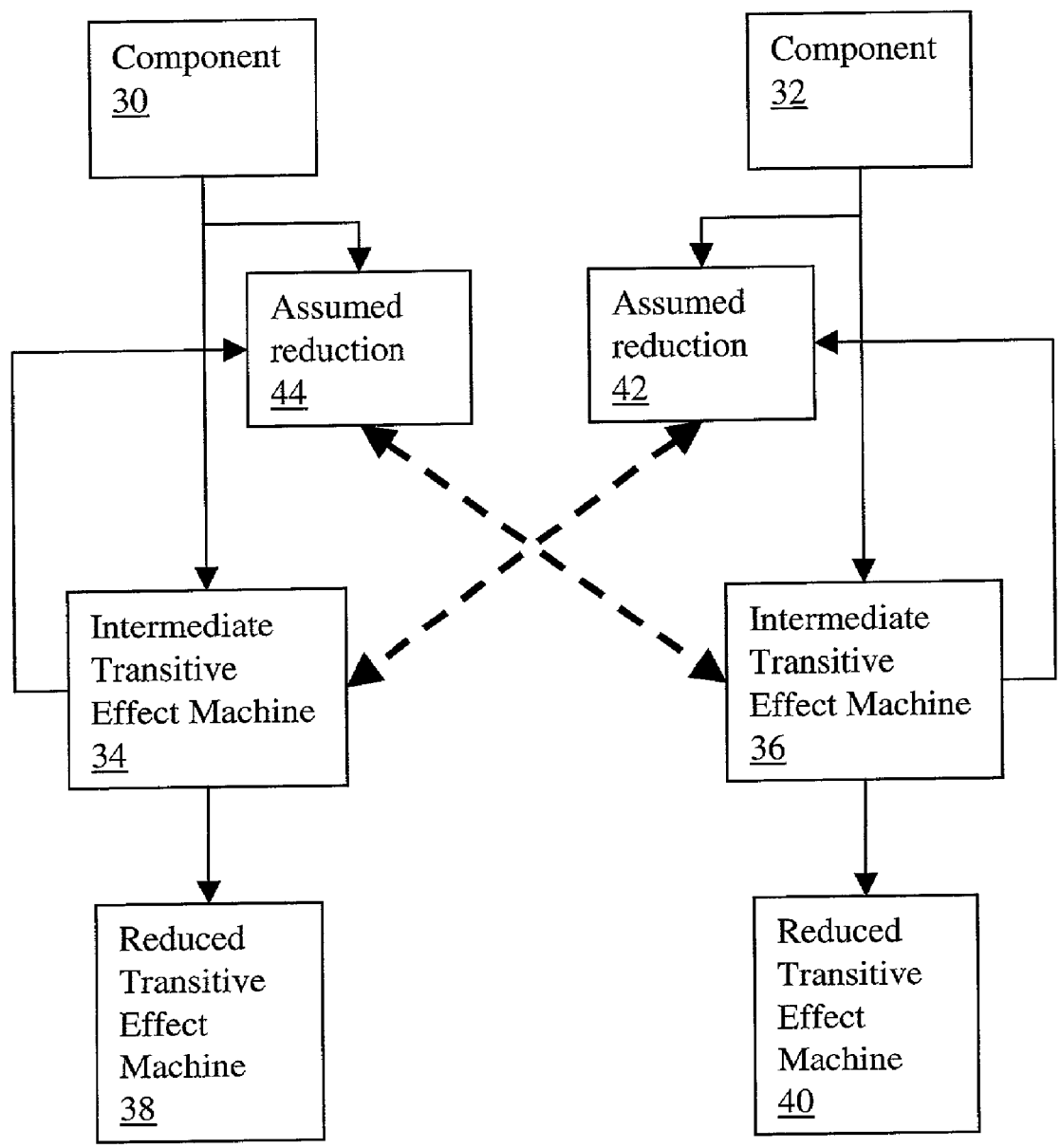
FIG. 5 is a block diagram showing the steps used to generate transitive effects machines for reduced components, in accordance with the preferred embodiment.

FIG. 5 illustrates the approach of the preferred embodiment using representative components 30, 32. According to the preferred embodiment, an intermediate transitive effect machine 34 is defined based on component 30. Intermediate transitive effect machine 36 is similarly defined based on component 32. However, the transitive effects in intermediate transitive effect 34 are not defined with respect to component 32, but with respect to assumed reduction 42. Assumed reduction 42 is initially derived from component 32.

In a similar way, intermediate transitive effect machine 36 is defined using assumed reduction 44, based on component 30.

The definitions of intermediate transitive effect machines 34, 36 are iteratively defined in that the assumed reductions 42, 44 must match iterative transitive effect machine 36, 34 respectively, before final transitive effect machines 40, 38 are arrived at.

In one implementation of the preferred embodiment, the initial assumed reduced component corresponding to each originally defined component in the set of components is a reduction to a class of states including all states in the component. In the example of FIG. 5, the initial definition of assumed reduction 42 will be a single class that includes all states in component 32. The first definition for intermediate transitive effect machine 34 will therefore be based on transitive effects defined with respect to the single class of this first definition of assumed reduction 42. In some cases, information may be available about the modelled system that is not encapsulated in the state and event model. Such information about the system behaviour may be used to permit the definition of a more precise initial assumed reduction.

According to the preferred embodiment, the definitions of the reductions of the intermediate transitive effect machines 34, 36 are compared with the definitions of the assumed reductions 44, 42, respectively. The comparison can be carried out to determine if each state is grouped with the same set of states in both classifications. Another approach is to use information, other than that encapsulated in the state machine model, which may be available relating to the intermediate transitive effect machine to further identify consistent classifications. As will be apparent to those skilled in the art, the use of such information is not required in the system of the preferred embodiment but the preferred embodiment does not preclude the use of such information by the system where it is available.

In the system of the preferred embodiment, if the classes in the assumed reduced components are not consistent with the classes in the reduction of the intermediate transitive effect machines, then the inconsistent assumed reductions are redefined to permit a further successive generation of intermediate transitive effect machines to be carried out. One approach to this redefinition of the assumed reduced components is to replace the classes in the assumed reduction with the classes in the corresponding transitive effect machine. Another approach may use other information known about the intermediate transitive effect machine to further refine the definition of the assumed reduction.

Once an assumed reduction is redefined, the system of the preferred embodiment redefines the intermediate transitive effect machines that were defined based on the assumed reduction. As is shown in FIG. 5, intermediate transitive effect machine 34, 36 may be redefined successively, based on similarly redefined assumed reductions 44, 42. Where the classes in assumed reductions 44, 42 are consistent with intermediate transitive effect machines 34, 36 respectively, the reached definitions of the reductions of the intermediate transitive effect machines 34, 36 are defined to be final reduced transitive effect machines 38, 40 respectively.

In this way, a set of reduced transitive effect machines may be generated for desired components in the state space.

The result of the steps carried out by the system of the preferred embodiment is a compositional state machine that is guaranteed to have the same properties of interest as the original state machine model, with respect to the events of interest. This model may then be used to carry out a desired analysis (relating to the defined events of interest). The reduced state space is generated without the onerous overhead requirements of a full composition of the components of the model.

The above description refers to two example components (30, 32). As will be understood by those skilled in the art, the system may be implemented for multiple components.

According to the preferred embodiment, the set of components to be reduced may be fine tuned to be a subset of the full set of components in the state space. Similarly, the transitive effect machine generated for each component may include effects on each of the other components in the state system or may include only effects on a defined subset of the components.

The different steps in the above approach are illustrated with reference to the example model of FIGS. 1, 2, 3. The method described above in general with respect to the example of FIG. 5 is illustrated in detail with respect to FIGS. 7 to 11 and Tables 1 to 11.

In the example shown in these figures, the events of interest are defined to be the "compute result" and "store result" events. Thus, all other events are to be hidden. Furthermore, in the example of the preferred embodiment, the equivalence relation to be used is observation equivalence.

Table 1 shows the set of possible interactions for each event in the components shown in FIGS. 1, 2, 3. Each interaction is described as a triple of states of each component before the interaction, the event label, and a triple of states of each component after the interaction. Since the events, "retrieve result", and "display result" are not of interest, interactions induced by these events are labelled with the special label "tau". An example of an interaction is if the three components are in states 1, 4, and 6 respectively, then a "retrieve result" interaction will result in the components being in states 1, 3, and 7 respectively. Thus, (1,4,6)—retrieve results→(1,3,7) is an interaction. However, this interaction in Table 1 is shown as (1,4,6)—tau→(1,3,7) because "retrieve result" is not an event of interest in the example.

TABLE 1

Interactions for example system

| interactions using "compute result" | interactions using "store result" | interactions using "display result" | interactions using "retrieve result" |
|---|---|---|---|
| $(1,3,6) \xrightarrow{\text{compute result}} (2,3,6)$ | $(2,3,6) \xrightarrow{\text{store result}} (1,4,6)$ | $(1,3,7) \xrightarrow{\text{tau}} (1,3,6)$ | $(1,4,6) \xrightarrow{\text{tau}} (1,3,7)$ |
| $(1,3,7) \xrightarrow{\text{compute result}} (2,3,7)$ | $(2,3,7) \xrightarrow{\text{store result}} (1,4,7)$ | $(1,4,7) \xrightarrow{\text{tau}} (1,4,6)$ | $(1,5,6) \xrightarrow{\text{tau}} (1,4,7)$ |
| $(1,4,6) \xrightarrow{\text{compute result}} (2,4,6)$ | $(2,4,6) \xrightarrow{\text{store result}} (1,5,6)$ | $(1,5,7) \xrightarrow{\text{tau}} (1,5,6)$ | $(2,4,6) \xrightarrow{\text{tau}} (2,3,7)$ |
| $(1,4,7) \xrightarrow{\text{compute result}} (2,4,7)$ | $(2,4,7) \xrightarrow{\text{store result}} (1,5,7)$ | $(2,3,7) \xrightarrow{\text{tau}} (2,3,6)$ | $(2,5,6) \xrightarrow{\text{tau}} (2,4,7)$ |
| $(1,5,6) \xrightarrow{\text{compute result}} (2,5,6)$ | | $(2,4,7) \xrightarrow{\text{tau}} (2,4,6)$ | |
| $(1,5,7) \xrightarrow{\text{compute result}} (2,5,7)$ | | $(2,5,7) \xrightarrow{\text{tau}} (2,5,6)$ | |

As is indicated above, the transitive effect machines of the preferred embodiment are generated with reference to the transitive interactions of the model.

Table 2 shows the transitive interactions from Table 1.

TABLE 2

Transitive interactions for example system $(1,3,6) \xRightarrow{\text{compute result}} (2,3,6)$  $(1,3,7) \xRightarrow{\text{compute result}} (2,3,6)$  $(1,3,7) \xRightarrow{\text{compute result}} (2,3,7)$ $(1,4,6) \xRightarrow{\text{compute result}} (2,3,6)$  $(1,4,6) \xRightarrow{\text{compute result}} (2,3,7)$  $(1,4,6) \xRightarrow{\text{compute result}} (2,4,6)$ $(1,4,7) \xRightarrow{\text{compute result}} (2,3,6)$  $(1,4,7) \xRightarrow{\text{compute result}} (2,3,7)$  $(1,4,7) \xRightarrow{\text{compute result}} (2,4,6)$ $(1,4,7) \xRightarrow{\text{compute result}} (2,4,7)$  $(1,5,6) \xRightarrow{\text{compute result}} (2,3,6)$  $(1,5,6) \xRightarrow{\text{compute result}} (2,3,7)$ $(1,5,6) \xRightarrow{\text{compute result}} (2,4,6)$  $(1,5,6) \xRightarrow{\text{compute result}} (2,4,7)$  $(1,5,6) \xRightarrow{\text{compute result}} (2,5,6)$ $(1,5,7) \xRightarrow{\text{compute result}} (2,3,6)$  $(1,5,7) \xRightarrow{\text{compute result}} (2,3,7)$  $(1,5,7) \xRightarrow{\text{compute result}} (2,4,6)$ $(1,5,7) \xRightarrow{\text{compute result}} (2,4,7)$  $(1,5,7) \xRightarrow{\text{compute result}} (2,5,6)$  $(1,5,7) \xRightarrow{\text{compute result}} (2,5,7)$ $(2,3,6) \xRightarrow{\text{store result}} (1,3,7)$  $(2,3,6) \xRightarrow{\text{store result}} (1,4,6)$  $(2,3,7) \xRightarrow{\text{store result}} (1,3,7)$ $(2,3,7) \xRightarrow{\text{store result}} (1,4,6)$  $(2,3,7) \xRightarrow{\text{store result}} (1,4,7)$  $(2,4,6) \xRightarrow{\text{store result}} (1,3,7)$ $(2,4,6) \xRightarrow{\text{store result}} (1,4,6)$  $(2,4,6) \xRightarrow{\text{store result}} (1,4,7)$  $(2,4,6) \xRightarrow{\text{store result}} (1,5,6)$ $(2,4,7) \xRightarrow{\text{store result}} (1,3,7)$  $(2,4,7) \xRightarrow{\text{store result}} (1,4,6)$  $(2,4,7) \xRightarrow{\text{store result}} (1,4,7)$ $(2,4,7) \xRightarrow{\text{store result}} (1,5,6)$  $(2,4,7) \xRightarrow{\text{store result}} (1,5,7)$  $(2,5,6) \xRightarrow{\text{store result}} (1,3,7)$ $(2,5,6) \xRightarrow{\text{store result}} (1,4,6)$  $(2,5,6) \xRightarrow{\text{store result}} (1,4,7)$  $(2,5,6) \xRightarrow{\text{store result}} (1,5,6)$ TABLE 2-continued Transitive interactions for example system $(2,5,6) \xrightarrow{\text{store result}} (1,5,7) \quad (2,5,7) \xrightarrow{\text{store result}} (1,3,7) \quad (2,5,7) \xrightarrow{\text{store result}} (1,4,6)$ $(2,5,7) \xrightarrow{\text{store result}} (1,4,7) \quad (2,5,7) \xrightarrow{\text{store result}} (1,5,6) \quad (2,5,7) \xrightarrow{\text{store result}} (1,5,7)$ As this example of the preferred embodiment uses observation equivalence for the equivalence relation, a transitive interaction includes any number of consecutive interactions with tau labels, followed by an interaction with a label of interest (in the example by a compute result or store result event), followed by any number of interactions with tau labels. For a different equivalence relation, a different set of transitive interactions would be used. A transitive interaction in this example is (1,3,7)==compute result=>(2,3,6), since there is an interaction (1,3,7)—compute result→(2,3,7) followed by an interaction (2,3,7)—tau→(2,3,6).

The generated transitive interactions may be classified with reference to interactions in one of the components in the model. In the example of the preferred embodiment, Table 3 shows, for the computation component, the effect of interactions of the other two components without any reduction of the other components.

TABLE 3

Equivalent effect of transitive interactions for computation component

| Transition of computation component | 2 → 1 | 1 → 2 |
|---|---|---|
| Equivalent effects induced by transition | $(3,6) \xrightarrow{\text{store result}} ([3],[7])$ | $(3,6) \xrightarrow{\text{compute result}} ([3],[6])$ |
| | $(3,6) \xrightarrow{\text{store result}} ([4],[6])$ | $(3,7) \xrightarrow{\text{compute result}} ([3],[6])$ |
| | $(3,7) \xrightarrow{\text{store result}} ([4],[6])$ | $(3,7) \xrightarrow{\text{compute result}} ([3],[7])$ |
| | $(3,7) \xrightarrow{\text{store result}} ([3],[7])$ | $(4,6) \xrightarrow{\text{compute result}} ([3],[6])$ |
| | $(3,7) \xrightarrow{\text{store result}} ([4],[7])$ | $(4,6) \xrightarrow{\text{compute result}} ([3],[7])$ |
| | $(4,6) \xrightarrow{\text{store result}} ([4],[6])$ | $(4,6) \xrightarrow{\text{compute result}} ([4],[6])$ |
| | $(4,6) \xrightarrow{\text{store result}} ([3],[7])$ | $(4,7) \xrightarrow{\text{compute result}} ([3],[6])$ |
| | $(4,6) \xrightarrow{\text{store result}} ([4],[7])$ | $(4,7) \xrightarrow{\text{compute result}} ([4],[6])$ |
| | $(4,6) \xrightarrow{\text{store result}} ([5],[6])$ | $(4,7) \xrightarrow{\text{compute result}} ([3],[7])$ |
| | $(5,6) \xrightarrow{\text{store result}} ([3],[7])$ | $(4,7) \xrightarrow{\text{compute result}} ([4],[7])$ |
| | $(5,6) \xrightarrow{\text{store result}} ([4],[6])$ | $(5,6) \xrightarrow{\text{compute result}} ([3],[6])$ |
| | $(5,6) \xrightarrow{\text{store result}} ([5],[6])$ | $(5,6) \xrightarrow{\text{compute result}} ([4],[6])$ |
| | $(5,6) \xrightarrow{\text{store result}} ([4],[7])$ | $(5,6) \xrightarrow{\text{compute result}} ([3],[7])$ |
| | $(5,6) \xrightarrow{\text{store result}} ([5],[7])$ | $(5,6) \xrightarrow{\text{compute result}} ([4],[7])$ |
| | $(4,7) \xrightarrow{\text{store result}} ([4],[6])$ | $(5,6) \xrightarrow{\text{compute result}} ([5],[6])$ |

TABLE 3-continued

Equivalent effect of transitive interactions for computation component

| Transition of computation component | 2 → 1 | 1 → 2 |
|---|---|---|
| | (4,7) —store result→ ([3],[7]) | (5,7) —compute result→ ([3],[6]) |
| | (4,7) —store result→ ([5],[6]) | (5,7) —compute result→ ([4],[6]) |
| | (4,7) —store result→ ([4],[7]) | (5,7) —compute result→ ([3],[7]) |
| | (4,7) —store result→ ([5],[7]) | (5,7) —compute result→ ([5],[6]) |
| | (5,7) —store result→ ([3],[7]) | (5,7) —compute result→ ([4],[7]) |
| | (5,7) —store result→ ([4],[6]) | (5,7) —compute result→ ([5],[7]) |
| | (5,7) —store result→ ([5],[6]) | |
| | (5,7) —store result→ ([4],[7]) | |
| | (5,7) —store result→ ([5],[7]) | |

For each transition in the computation component, the set of equivalent effects is the set of changes in (the reduced versions of) the other two components that can occur as a result of interactions. In the preferred embodiment, when generating the equivalent effects, the equivalent effect is first defined in terms of classes of states in the components of interest. An example of an equivalent effect for the transition from state 2 to state 1 is (3,6)==store result=>([4],[6]), which implies the communication component changes from state 3 to class [4], while the display component changes from state 6 to class [6]. This effect is produced by the interaction previously stored as (2,3,6)==store result=>(1,4, 6).

As referred to above, an iterative process is followed to define the reduced transitive effect machines for the compositional state system of interest. This iterative process is commenced by assuming that components in the state system are reduced to the minimal equivalent classes. Table 4 shows, for each transition, the equivalent effects on other components under the assumed classification that all states in other components are reduced to the same class. For example, the equivalent effect (3,6)==store result=>([4],[6]) can also be written as (3,6)==store result=>([3],[6]) since [4]=[3]. Thus, the following set of effects from Table 3 is the same single equivalent effect in Table 4:

(5,7) —store result→ ([3],[7])

(5,7) —store result→ ([4],[6])

(5,7) —store result→ ([5],[6])

-continued (5,7) —store result→ ([4],[7])

(5,7) —store result→ ([5],[7])

The resulting set of equivalent effects for the transitions of the computational component is shown in Table 4.

TABLE 4

Equivalent effect of transitive interactions for computation component, with assumed classification [1] = [2], [3] = [4] = [5], and [6] = [7]

| 2 → 1 | 1 → 2 |
|---|---|
| (3,6) —store result→ ([3],[6]) | (3,6) —compute result→ ([3],[6]) |
| (3,7) —store result→ ([3],[6]) | (4,6) —compute result→ ([3],[6]) |
| (4,6) —store result→ ([3],[6]) | (4,7) —compute result→ ([3],[6]) |
| (5,6) —store result→ ([3],[6]) | (5,6) —compute result→ ([3],[6]) |
| (4,7) —store result→ ([3],[6]) | (5,7) —compute result→ ([3],[6]) |
| (5,7) —store result→ ([3],[6]) | |

As a further optimisation, the preferred embodiment merges effects that are associated with the same set of transitions. (This step is not shown in FIG. 5.) For purposes of equivalence reduction, two equivalent effects are the same if they are associated with the same set of transitions—they have the same effect on the equivalence or non-equivalence of states. In the example, the merged effect is labelled Effectn, where n is a numeric tag. Thus Table 5 shows the merged labels for the computation component. In the simple example of the figures, there are only two effects, Effect1 and Effect2. Effect1 represents a merger of effects

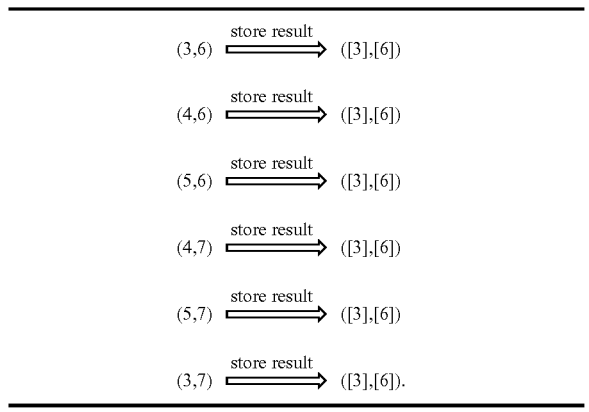

These effects may be merged to the single merged effect Effect1 because they are each an effect associated with the single transition 2→1 in the computation component. Effect2 represents the effects

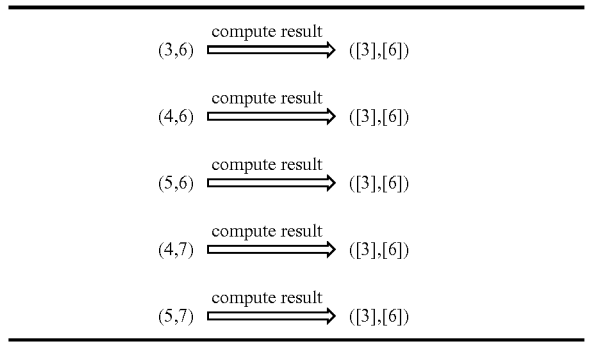

which are all effects that are associated with the 1→2 transition only.

The resulting table of merged effects is shown in Table 5.

TABLE 5

| Merged effects for computation component | |
|---|---|
| 2→1 | 1→2 |
| Effect1 | Effect2 |

Figure 6:
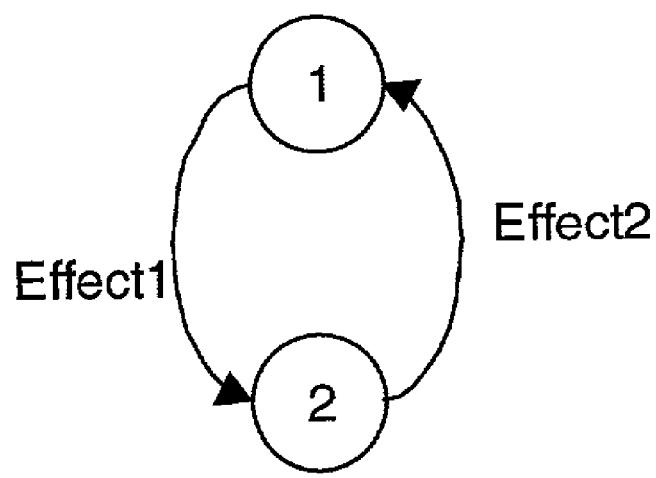
FIG. 6 is a state diagram showing the transitive effects machine produced in accordance with the preferred embodiment for the computation component of FIG. 1.
Figure 7:
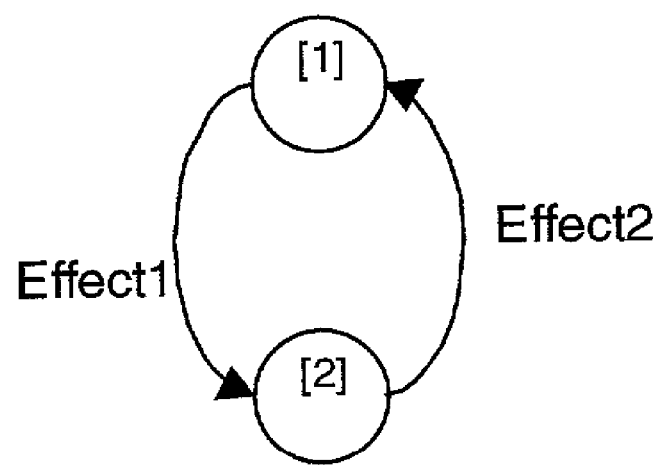
FIG. 7 is a state diagram showing the reduced transitive effects machine that may be produced in accordance with the preferred embodiment for the computation component of FIG. 1.
Figure 8:
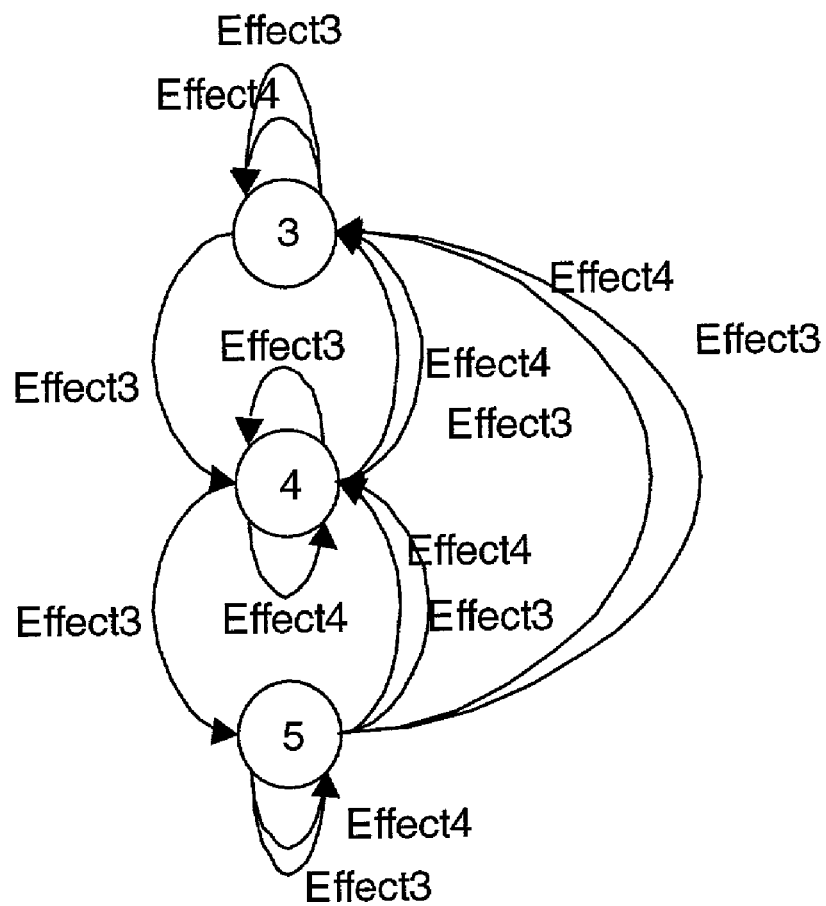
FIG. 8 is a state diagram showing the transitive effects machine produced in accordance with the preferred embodiment for the communication component of FIG. 1.

FIG. 6 shows the intermediate transitive effect machine for the computation component, in which edges are labelled with merged equivalent effects shown in Table 5. FIG. 7 shows the reduction of the intermediate transitive effect machine, which is the transitive effect machine of FIG. 6 after states are classified using observation equivalence. The reduction from the finite state machine of FIG. 6 to FIG. 7 is carried out using known prior art reduction techniques.

Note that for the computation component, the states have not been reduced to a single class (FIG. 7 shows classes [1] and [2]). This implies that any intermediate transitive effect machines defined using the assumption that all states reduced to a single class will need to be redefined. In this example, such intermediate transitive effect machines have yet to be defined. In the system of the preferred embodiment it is possible to alter the definition of the assumed reduced components to reflect the inconsistent classes in the assumed reduced component and the reduced transitive effect machine. Thus, in the example described below, successive definitions of intermediate transitive effect machines will use an updated classification for the assumed reduced component, based on the fact that the reduced transitive effect machine for the computation component did not reduce to a single class (and was therefore inconsistent with the first definition of the assumed reduced component).

The steps set out above for the computation component are repeated in the system of the preferred embodiment for the communication component and the display component in the example of the figures. Tables 6 to 11 show the different values determined for the transitive effects, equivalent effects with the updated assumed reduction, and merged effects for the transitions in the communication and display components, respectively. The values shown in the tables are reflected in FIGS. 8 and 10 which show the intermediate transitive effect machines for the communication and display components respectively, and in FIGS. 9 and 11 which show the reduced intermediate transitive effect machines for the communication and display components, respectively.

TABLE 6

| Equivalent effect of transitive interactions for communication component | |
|---|---|
| 3 → 3 | 3 → 4 |
| (1,6) —compute result→ ([2],[6]) | (2,6) —store result→ ([1],[6]) |
| (1,7) —compute result→ ([2],[6]) | (2,7) —store result→ ([1],[6]) |
| (1,7) —compute result→ ([2],[7]) | (2,7) —store result→ ([1],[7]) |
| (2,6) —store result→ ([1],[7]) | |
| (2,7) —store result→ ([1],[7]) | |

TABLE 6-continued

Equivalent effect of transitive interactions for communication component

4 → 3

(1,6) —compute result→ ([2],[6])
(1,6) —compute result→ ([2],[7])
(1,7) —compute result→ ([2],[6])
(1,7) —compute result→ ([2],[7])
(2,6) —store result→ ([1],[7])
(2,7) —store result→ ([1],[7])

4 → 4

(1,6) —compute result→ ([2],[6])
(1,7) —compute result→ ([2],[6])
(1,7) —compute result→ ([2],[7])
(2,6) —store result→ ([1],[6])
(2,6) —store result→ ([1],[7])
(2,7) —store result→ ([1],[6])
(2,7) —store result→ ([1],[7])

4 → 5

(2,6) —store result→ ([1],[6])
(2,7) —store result→ ([1],[6])
(2,7) —store result→ ([1],[7])

5 → 3

(1,6) —compute result→ ([2],[6])
(1,6) —compute result→ ([2],[7])
(1,7) —compute result→ ([2],[6])
(1,7) —compute result→ ([2],[7])
(2,6) —store result→ ([1],[7])
(2,7) —store result→ ([1],[7])

5 → 4

(1,6) —compute result→ ([2],[6])
(1,6) —compute result→ ([2],[7])
(1,7) —compute result→ ([2],[6])
(1,7) —compute result→ ([2],[7])
(2,6) —store result→ ([1],[6])
(2,6) —store result→ ([1],[7])
(2,7) —store result→ ([1],[6])
(2,7) —store result→ ([1],[7])

5 → 5

(1,6) —compute result→ ([2],[6])
(1,7) —compute result→ ([2],[6])
(1,7) —compute result→ ([2],[7])
(2,6) —store result→ ([1],[6])
(2,6) —store result→ ([1],[7])
(2,7) —store result→ ([1],[6])
(2,7) —store result→ ([1],[7])

TABLE 7

Equivalent effect of transitive interactions for communication component, with updated assumed classification [1], [2], [3] = [4] = [5], and [6] = [7]

3 → 3

(1,6) —compute result→ ([2],[6])
(1,7) —compute result→ ([2],[6])
(2,6) —store result→ ([1],[6])
(2,7) —store result→ ([1],[6])

4 → 4

(2,6) —store result→ ([1],[6])
(2,7) —store result→ ([1],[6])

TABLE 7-continued

Equivalent effect of transitive interactions for communication component, with updated assumed classification [1], [2], [3] = [4] = [5], and [6] = [7]

4 → 3
(1,6) —compute result→ ([2],[6])
(1,7) —compute result→ ([2],[6])
(2,6) —store result→ ([1],[6])
(2,7) —store result→ ([1],[6])

4 → 4
(1,6) —compute result→ ([2],[6])
(1,7) —compute result→ ([2],[6])
(2,6) —store result→ ([1],[6])
(2,7) —store result→ ([1],[6])

4 → 5
(2,6) —store result→ ([1],[6])
(2,7) —store result→ ([1],[6])

5 → 3
(1,6) —compute result→ ([2],[6])
(1,7) —compute result→ ([2],[6])
(2,6) —store result→ ([1],[6])
(2,7) —store result→ ([1],[6])

5 → 4
(1,6) —compute result→ ([2],[6])
(1,7) —compute result→ ([2],[6])
(2,6) —store result→ ([1],[6])
(2,7) —store result→ ([1],[6])

5 → 5
(1,6) —compute result→ ([2],[6])
(1,7) —compute result→ ([2],[6])
(2,6) —store result→ ([1],[6])
(2,7) —store result→ ([1],[6])

TABLE 8

Merged effects for communication component

3 → 3
Effect3
Effect4

3 → 4
Effect3

4 → 3
Effect3
Effect4

4 → 4
Effect3
Effect4

4 → 5
Effect3

5 → 3
Effect3
Effect4

5 → 4
Effect3
Effect4

5 → 5
Effect3
Effect4

Effect3 merges
(2,6) —store result→ ([1],[6])
(2,7) —store result→ ([1],[6])

Effect4 merges
(1,6) —compute result→ ([2],[6])
(1,7) —compute result→ ([2],[6])

TABLE 9

Equivalent effect of transitive interactions for display component

6→6
(1,3) —compute result→ ([2],[3])
(1,4) —compute result→ ([2],[3])

TABLE 9-continued

Equivalent effect of transitive interactions for display component (1,4) —compute result→ ([2],[4])
(1,5) —compute result→ ([2],[3])
(1,5) —compute result→ ([2],[4])
(1,5) —compute result→ ([2],[5])
(2,3) —store result→ ([1],[4])
(2,4) —store result→ ([1],[4])
(2,4) —store result→ ([1],[5])
(2,5) —store result→ ([1],[4])
(2,5) —store result→ ([1],[5])

6→7
(1,4) —compute result→ ([2],[3])
(1,5) —compute result→ ([2],[3])
(1,5) —compute result→ ([2],[4])
(2,3) —store result→ ([1],[3])

TABLE 9-continued

Equivalent effect of transitive interactions for display component $(2,4) \xrightarrow{\text{store result}} ([1],[3])$ $(2,4) \xrightarrow{\text{store result}} ([1],[4])$ $(2,5) \xrightarrow{\text{store result}} ([1],[3])$ $(2,5) \xrightarrow{\text{store result}} ([1],[4])$ $(2,5) \xrightarrow{\text{store result}} ([1],[5])$ $7 \to 6$ $(1,3) \xrightarrow{\text{compute result}} ([2],[3])$ $(1,4) \xrightarrow{\text{compute result}} ([2],[3])$ $(1,4) \xrightarrow{\text{compute result}} ([2],[4])$ $(1,5) \xrightarrow{\text{compute result}} ([2],[3])$ $(1,5) \xrightarrow{\text{compute result}} ([2],[4])$ $(1,5) \xrightarrow{\text{compute result}} ([2],[5])$ $(2,3) \xrightarrow{\text{store result}} ([1],[4])$ $(2,4) \xrightarrow{\text{store result}} ([1],[4])$ $(2,4) \xrightarrow{\text{store result}} ([1],[5])$ $(2,5) \xrightarrow{\text{store result}} ([1],[4])$ $(2,5) \xrightarrow{\text{store result}} ([1],[5])$ $7 \to 7$ $(1,3) \xrightarrow{\text{compute result}} ([2],[3])$ $(1,4) \xrightarrow{\text{compute result}} ([2],[3])$ $(1,4) \xrightarrow{\text{compute result}} ([2],[4])$ $(1,5) \xrightarrow{\text{compute result}} ([2],[3])$ $(1,5) \xrightarrow{\text{compute result}} ([2],[4])$ $(1,5) \xrightarrow{\text{compute result}} ([2],[5])$ $(2,3) \xrightarrow{\text{store result}} ([1],[3])$ $(2,3) \xrightarrow{\text{store result}} ([1],[4])$ $(2,4) \xrightarrow{\text{store result}} ([1],[3])$ $(2,4) \xrightarrow{\text{store result}} ([1],[4])$ $(2,4) \xrightarrow{\text{store result}} ([1],[5])$ $(2,5) \xrightarrow{\text{store result}} ([1],[3])$ $(2,5) \xrightarrow{\text{store result}} ([1],[4])$ $(2,5) \xrightarrow{\text{store result}} ([1],[5])$

TABLE 10

Equivalent effect of transitive interactions for display component, with updated assumed classification
[1], [2], [3] = [4] = [5], and [6] = [7]

$6 \to 6$ $(1,3) \xrightarrow{\text{compute result}} ([2],[3])$ $(1,4) \xrightarrow{\text{compute result}} ([2],[3])$ $(1,5) \xrightarrow{\text{compute result}} ([2],[3])$ $(2,3) \xrightarrow{\text{store result}} ([1],[3])$ $(2,4) \xrightarrow{\text{store result}} ([1],[3])$ $(2,5) \xrightarrow{\text{store result}} ([1],[3])$ $6 \to 7$ $(1,4) \xrightarrow{\text{compute result}} ([2],[3])$ $(1,5) \xrightarrow{\text{compute result}} ([2],[3])$ $(2,3) \xrightarrow{\text{store result}} ([1],[3])$ $(2,4) \xrightarrow{\text{store result}} ([1],[3])$ $(2,5) \xrightarrow{\text{store result}} ([1],[3])$ $7 \to 6$ $(1,3) \xrightarrow{\text{compute result}} ([2],[3])$ $(1,4) \xrightarrow{\text{compute result}} ([2],[3])$ $(1,5) \xrightarrow{\text{compute result}} ([2],[3])$ $(2,3) \xrightarrow{\text{store result}} ([1],[3])$ $(2,4) \xrightarrow{\text{store result}} ([1],[3])$ $(2,5) \xrightarrow{\text{store result}} ([1],[3])$

TABLE 10-continued

Equivalent effect of transitive interactions for display component,
with updated assumed classification
[1], [2], [3] = [4] = [5], and [6] = [7]

$7 \rightarrow 7$ $(1,3) \xrightarrow{\text{compute result}} ([2],[3])$ $(1,4) \xrightarrow{\text{compute result}} ([2],[3])$ $(1,5) \xrightarrow{\text{compute result}} ([2],[3])$ $(2,3) \xrightarrow{\text{store result}} ([1],[3])$ $(2,3) \xrightarrow{\text{store result}} ([1],[3])$ $(2,4) \xrightarrow{\text{store result}} ([1],[3])$ $(2,5) \xrightarrow{\text{store result}} ([1],[3])$

TABLE 11

Merged effects for display component $6 \rightarrow 6$

Effect5
Effect6

$6 \rightarrow 7$

Effect6

$7 \rightarrow 6$

Effect5
Effect6

$7 \rightarrow 7$

Figure 9:
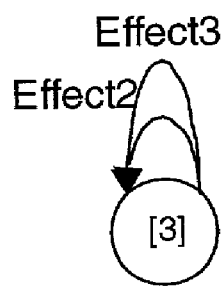
FIG. 9 is a state diagram showing the reduced transitive effects machine that may be produced in accordance with the preferred embodiment for the communication component of FIG. 1.
Figure 10:
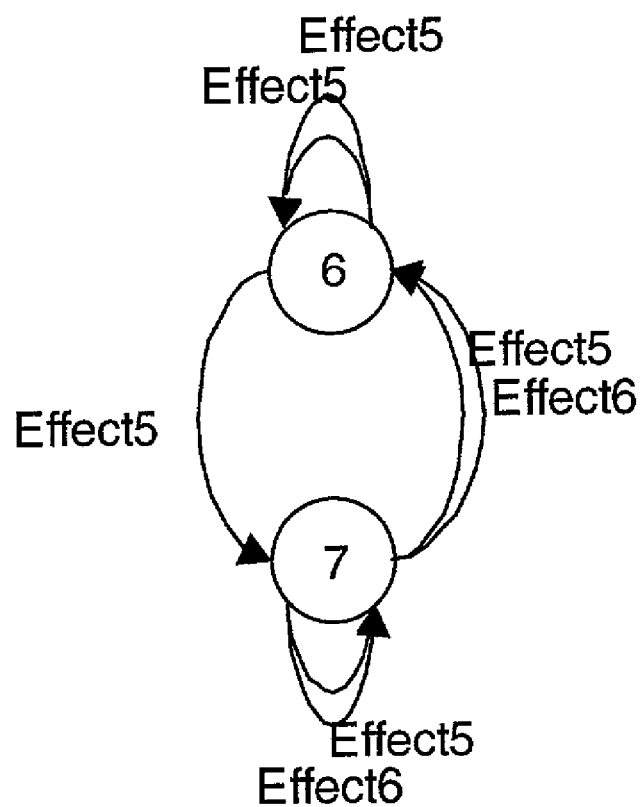
Figure 11:
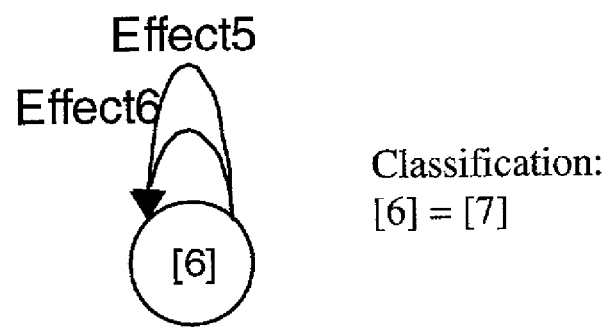

Effect5
Effect6
Effect5 merges $(1,3) \xrightarrow{\text{compute result}} ([2],[3])$ Effect6 merges $(1,4) \xrightarrow{\text{compute result}} ([2],[3])$ $(1,5) \xrightarrow{\text{compute result}} ([2],[3])$ $(2,3) \xrightarrow{\text{store result}} ([1],[3])$ $(2,4) \xrightarrow{\text{store result}} ([1],[3])$ $(2,5) \xrightarrow{\text{store result}} ([1],[3])$ As is apparent from Tables 6–11 and FIGS. 9, 11, the classification of the communications and display components are consistent with the assumed reduced components as both reduced to a single class. For this reason, the intermediate transitive effect machine of the computation component need not be redefined. Hence, for this very simple example, the reduction is shown to be consistent immediately, and the final reduced transitive effect machine is shown in FIGS. 7, 9, and 11.

The reduced transitive effect machine of FIGS. 7, 9, and 11 can be used instead of the original state machine of FIGS. 1, 2, and 3 for an analysis that is concerned with either the events compute result or store result. The reduced state space is guaranteed to be observationally equivalent to the original state machine, insofar as the "compute result" and "retrieve result" events are concerned.

Note that the reduced transitive effect machine is not an LTS, in that the interactions are not defined as edges with the same label. Instead, the interactions are defined by the set of transitive interactions (reduced by the classification). However, where an LTS is desired, it is possible to convert the reduced transitive effect machine into an equivalent LTS. For each transitive interaction, a label is created with the reduced states in the interactions, and transitions are created in each of the reduced components with the label. For example, for a transitive interaction $(1,3,6) \xrightarrow{\text{compute result}} (2,3,6)$, create a label "$([1],[3],[6]) \Longrightarrow \text{compute result} \Longrightarrow ([2],[3],[6])$", and the following transitions:

$[1] \xrightarrow{([1],[3],[6]) \Longrightarrow \text{compute result} \Longrightarrow ([2],[3],[6])} [2]$ in the computation component, $[3] \xrightarrow{([1],[3],[6]) \Longrightarrow \text{compute result} \Longrightarrow ([2],[3],[6])} [3]$ in the communications component, $[6] \xrightarrow{([1],[3],[6]) \Longrightarrow \text{compute result} \Longrightarrow ([2],[3],[6])} [6]$ in the display component The result is an LTS representation of the reduced transitive effect machine.

The approach of the preferred embodiment, described with reference to the example shown in the figures, may also be more generally described using the standard LTS nomenclature (see R. Milner (1980), A Calculus of Communication Systems, LNCS 92, Springer-Verlag).

In this general description, S1, . . . , Sn are defined to be components in a compositional state system, (S1 ∥ . . . ∥ Sn)<L>, and L is defined to be the set of labels of interest. In the description, p1,p2, . . . ,pn,q1,q2, . . . ,qn are states in S1, . . . , Sn, and [Si] is a classification of the states of Si, where equivalent states are put into the same class: [pi]=[qi] iff pi is equivalent to qi.

In the preferred embodiment, the following steps are carried out, using the notation set out above:

1. Calculate the transitive effect of interactions by storing the interaction (p1,p2, . . . ,pn)

$\xRightarrow{a}$ (q1,q2, . . . ,qn) whenever the state (p1,p2, . . . ,pn) is reachable implies there is a transition (p1,p2, . . . ,pn)

$\xRightarrow{a}$ (q1,q2, . . . ,qn) in (S1 ∥ . . . ∥ Sn)<L>.
(This step is shown in Tables 1 and 2)

2. Commencing with an initial classification [S1], . . . , [Sn] of S1, . . . ,Sn, where all states of each Si are assumed to be in the same class, and an initial set of components to be reduced consisting of all components, perform the following steps:

a. Remove a component Si from the set of components to be reduced and compute the assumed equivalent effects for Si: For each interaction (p1,p2, . . . ,pn)

$$\xrightarrow{a}$$

(q1,q2, . . . ,qn), associate the equivalent effect (p1, . . . , pi−1,pi+1, . . . ,pn)

$$\xrightarrow{a}$$

([q1], . . . , [qi−1], [qi+1], . . . [qn]) with the transition pi→qi.
(This step is show in Tables 3, 4, 6, 7, 9, and 10 for the example system).

b. Merge equivalent effects for Si: two equivalent effects A and B can be merged if whenever a transition pi→qi of Si is associated with the equivalent effect A, then the state change is also associated with the equivalent effect B, and vice versa.
(This step is show in Tables 5, 8, and 11 for the example system.)

c. Create the transitive effect machine $Si_1$: create transitions labelled with merged equivalent effects: pi $$\xrightarrow{A}$$

qi.
(This step is show in FIG. 6, 8, and 10 for the example system.)

d. Classify states of the transitive effect machine $Si_1$ to obtain the reduced transitive effect machine, $[Si]_1$ by placing all equivalent states into the same class: $[p]_1=[q]_1$ iff p is equivalent to q in $Si_1$.
(This step is show in FIG. 7, 9, and 11 for the example system.)

e. If [Si] is different from $[Si]_1$, add components that used [Si] to the set of components to be reduced, and update the definition of [Si] based on $[Si]_1$.

3. Repeat Steps 2a to 2d until the set of components to be reduced is empty.
(Subsequent iterations are show in Tables 8 to 11, and FIGS. 8 to 11 for the example system.)

The final result of the preferred embodiment is the reduced transitive effect machines [S1], . . . , [Sn]. (This final result is show in FIG. 7, 9, and 11 for the example system.)

Note however, an implementation may vary the steps of the preferred embodiment in several ways, depending on the resources available and the complexity of the system modelled.

Three variations referred to above are: varying the derivation of the initial assumed reduction, varying the comparison between the reduced intermediate effects machine the assumed reduction, and varying the derivation of the next assumed reduction.

Also as mentioned above, the set of transitive interactions may not need to include all possible sequences of interactions. An example is when the implementation of the preferred embodiment may compute a reduced set of transitive interactions by computing only the transitive interactions for each subset of components that interact directly. Thus, in the example above, an interaction between the pair of computation and communication components, followed by an interaction between the pair of communication and display components, would not be combined create a third transitive interaction, but kept as two transitive interactions.

For a subset of components, $\{Si_1 \ldots Si_m\}$, the implementation needs to compute the transitive effects of interactions $$(p1, \ldots, pi_1-1, pi_1, pi_1+1, \ldots, pi_m-1, pi_m, pi_m+1, \ldots, pn)$$

$$\xrightarrow{A}$$

$$(p1, \ldots, pi_1-1, qi_1, pi_1+1, \ldots, pi_m-1, qi_m, pi_m+1, \ldots, pn)$$

whenever there the state $(p1, \ldots, pi_1-1, pi_1, pi_1+1, \ldots, pi_m-1, pi_m, pi_m+1, \ldots, pn)$ is reachable implies there is a transition $$(p1, \ldots, pi_1-1, pi_1, pi_1+1, \ldots, pi_m-1, pi_m, pi_m+1, \ldots, pn)$$

$$\xrightarrow{A}$$

$$(p1, \ldots, pi_1-1, qi_1, pi_1+1, \ldots, pi_m-1, qi_m, pi_m+1, \ldots, pn)$$

in the system.

This approach reduces the number of transitive interactions overall, but at the cost of obtaining less of a reduction of the components.

Another variation mentioned above is the implementation may compute a set of intermediate reduced transitive effects machines [S1], . . . , [Sn] in parallel, not one at a time. This can reduce the time required to produce the reduction if sufficient resources are available.

A further variation is when the intermediate transitive effects machines are defined from the smallest component to the largest. The reason is if $[Si]_1$ is obtained, which is different from [Si], then the other intermediate transitive effects machines, Sj, dependent on [Si] must be redefined. If Sj is large, then a significant amount of computation time may have been expended without bringing the system closer to determining the final reduced state.

The preferred embodiment may be implemented using different computer systems. A software implementation of the preferred embodiment has been created, and has been used as part of a larger system to generate test cases for computer programs modelled as state machines. The software enabled test generation analysis to be performed for systems that were three times larger than was possible with previous techniques.

A test generator examines sequences of events to be executed by the system, starting from the initial state of the system, until the sequence of events satisfies the test requirements. Generating test cases for a complex system is difficult, as it requires analyzing the composition of the components in a system, thus encountering the state-explosion problem. Hence, reduction techniques are applicable. An embodiment of the invention, integrated into a test generation system, may be used to provide an efficient generation of test cases.

As is shown with the example referred to below, this embodiment supports the incremental use of the reductions of the preferred embodiment to allow even greater reductions in the size of machines which are in turn used to generate test cases.

Figure 12:
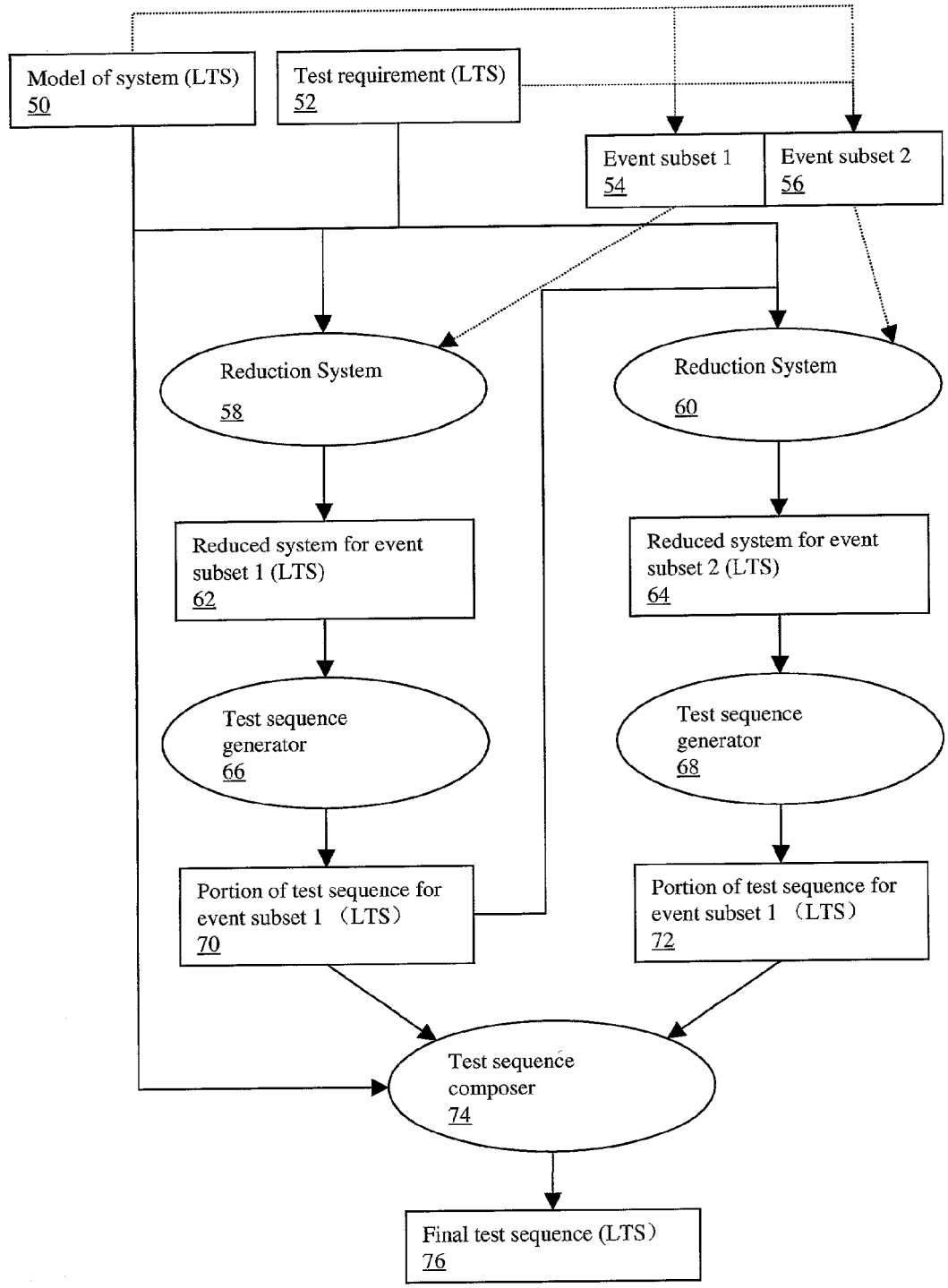
FIG. 12 is a block diagram showing an example of a system for efficiently generating test cases from models and test requirements, including the reduction system of the preferred embodiment.

It is known in the art to represent computer systems using state machine models (such as LTS) and to then use these formal representations to generate test cases that can be used to test complex computer systems. FIG. 12 is a flow diagram showing an example system using the preferred embodiment for test generation analysis. The system to be tested is represented by a compositional state system in LTS format and is shown in FIG. 12 as model 50. Test requirement 52 is also defined in LTS format and specifies what interactions of the system are to be tested. This will include test input and output events. A special "accept" label (event) is included in the test requirement LTS to designate when a satisfactory test sequence has been executed. In this case, the test requirement acts as a new component which is composed with model 50. By defining test requirement 52 in this way, and by composing test requirement 52 with model 50, the composed machine represents sequences of events that are of interest to be tested.

The example shown in FIG. 12 includes a division of the process into two streams, each stream reducing the system model for a subset of the events of interest. The test generation system therefore permits the division of the test input and output events of test requirement 52 into subsets (FIG. 12 shows two subsets, 54 and 56). Each subset includes the "accept" label. Reduction system 58 is a software implementation of the preferred embodiment and is used to produce reduced model 62 with respect to the first subset of events 54 (these events are defined to be of interest). The advantage of dividing up the events of interest, as described, is that the reduction achieved using the preferred embodiment is much greater when there are fewer events of interest. Experiments with divided event sets have shown orders of magnitude reductions in sizes of machines. In general, events of interest may be divided up into small subsets in any case where the analysis allows this (such as the illustrated example of incremental test generation).

As referred to above, reduced model 62 contains reductions of components in both system 50 and test requirement 52. Reduction system 58 includes a final step of converting the reduced transitive effect machines into an LTS format output. This step has the benefit of allowing the software to be used as a pre-processing step for an appropriate analysis tool that uses LTS, leading to a modular architecture for analysis.

In the example of FIG. 12, test sequence generator 66, using prior art techniques, then takes reduced model 62 in LTS format as input and produces as output partial test sequence 70 corresponding to events 54. Partial test sequence 70 is an LTS representation of a sequence of input and output events from the subset 54 that includes the special "accept" label of the test requirement.

Partial test sequence 70 is then composed with system model 50 and the test requirement 52 (represented in FIG. 12 by merged arrows prior to reduction system 60) to constrain the generation of further portions of the test sequence. This ensures separately generated portions can be combined into an actual test sequence of the system.

The reduction and generation process is repeated for event subset 56. The same software is used again as reduction system 60 to produce the reduction of model 50, test requirement 52, and portion of the test sequence 70, with respect to event subset 56. The reduced components will include the effects of partial test sequence 70, but not the actual events of partial test sequence 70. Then the same test sequence generator is used (shown as test generator 68) to generate partial test sequence 72 corresponding to the events. Partial test sequence 72 does not include events from partial test sequence 70, but is consistent with it.

Finally, the test sequence composer 74 combines the two portions of the test sequence 70 and 72, with the original model 50 to produce the final test sequence 76 as an LTS. The test sequence composer 74 is the same test sequence generator as test sequence generator 66 and 68, but it derives the entire sequence for all the events rather than a subset. The final test sequence generation is efficient because the state space is constrained by the generated test sequences 70 and 72.

Thus, the final test sequence is a sequence of all input and output events required to execute an interaction specified by the test requirement 52. The input and output events can then be mapped to actual input and output actions of the system to be tested, to exercise the system and check its correctness.

By reducing the LTS format model of the system and the test requirements using the preferred embodiment of the invention, the set of test cases can be arrived at without an expansion of the composition of the full model and test requirements as would otherwise be required. The use of the preferred embodiment provides that the final test sequence will be equivalent to what the test case generator would have produced for an expansion of the full system and test case requirements, but will require significantly less time and fewer resources. Experiments with a model of telephone exchange control software showed that the system was able to generate test sequences for models with significantly more components than would have been possible with previous techniques.

By the preferred embodiment reducing each component by itself, using information about interactions with other components, the above example implementation of the system of the preferred embodiment illustrates how the the state explosion problem is avoided.

Although a preferred embodiment of the present invention has been described here in detail, it will be appreciated by those skilled in the art that other variations may be made. For example, other methods of representing a compositional state system may be reduced by the preferred embodiment, such as Petri Nets, algebraic, or graphical representations. This and other variations may be made without departing from the spirit of the invention or the scope of the appended claims.

I claim:

1. A computer-implemented method for generating a reduced state space representation for a model in a compositional state system, the model comprising a selected set of components, each component comprising one or more states and one or more events, the model comprising interactions associated with events, the reduced state space representation being defined with respect to a set of events of interest selected from the events in the set of components, the method comprising the following steps:

a. for each component in the set of components, generating a transitive effect machine data structure for the component such that the states of the transitive effect machine represent the states of the component and the events of the transitive effect machine represent the transitive effects of interactions associated with transitions of the component, the transitive effects being defined relative to the set of components, and the set of events of interest, and b. selecting each of the generated transitive effect machine data structures, and for each selected transitive effect machine data structure, carrying out a computer-implemented reduction process on the selected transitive effect machine data structure to replace the selected transitive effect machine data structure with a reduced transitive effect machine data structure, each of the said reduction processes comprising the step of classifying states within the selected transitive effect machine to permit grouping of states into a single class defined by common properties of such states with respect to the set of events of interest.

2. The method of claim 1, in which the compositional state system supports labelled transition system models.

3. The method of claim 1, in which equivalent effects of transitive interactions for the transitions in the set of components are defined relative to a one of bisimulation or simulation equivalence.

4. The method of claim 1, in which equivalent effects of transitive interactions for the transitions in the set of components are defined relative to a one of observational equivalence or safety equivalence.

5. The method of claim 1, in which the transitive effect machines data structures are represented by BDDs.

6. The method of claim 1, comprising the further step of carrying out an expanding composition of the reduced state representation defined by the set of reduced transitive effect machines data structures.

7. The method of claim 1, comprising the further step of converting the reduced state representations to a labelled transition system representation.

8. A computer program product comprising a computer usable medium tangibly embodying computer readable program code for carrying out the method of claim 1.

9. A computer implemented method for generation of a reduced state space representation of a model in a compositional state system, the model comprising a set of components, each component comprising one or more states and one or more events, the model comprising interactions associated with events, the reduced state space representation being defined with respect to a set of events of interest selected from the events in the set of components, the method comprising the successive generation of a set of reduced transitive effect machines data structures relative to a set of successively defined assumed reduced components, each one of the reduced transitive effect machines data structures comprising classes and events and uniquely corresponding to a component in the set of components and each one of the assumed reduced components uniquely corresponding to a reduced transitive effect machine data structure and being derived from the corresponding component in the set of components and comprising a set of classes into which the states in the said component are grouped, the generation of each reduced transitive effect machine data structure comprising the steps of a. generating an intermediate transitive effect machine data structure comprising states and events, the states of the intermediate transitive effect machine data structure representing states of the component uniquely corresponding to the reduced transitive effect machine data structure and the events of the intermediate transitive effect machine data structure representing one or more sets of equivalent effects of transitive interactions.

the equivalent effects of transitive interactions being defined for a pair of states in the component uniquely corresponds to the reduced transitive effect machine data structure, the defined equivalent effects being determined with reference to the set of successively defined assumed reduced components, where equivalent effects represent the transitive effects of interactions associated with each of the said pair of states, on a selected number of assumed reduction components, the transitive effects being defined with respect to the set of events of interest, and b. generating the reduced transitive effect machine data structure by reducing the states in the intermediate transitive effect machine data structure to classes of states to define the classes in the reduced transitive effect machine data structure and by reducing the events in the intermediate transitive effect machine data structure to define the events in the reduced transitive effect machine data structure.

10. The method of claim 9 in which each defined assumed reduction component is initialized to a defined condition and in which the successive definitions of the assumed reduction component are derived from the corresponding reduced transitive effect machine data structure.

11. A computer program product comprising a computer usable medium tangibly embodying computer readable program code for carrying out the method of claim 10.

12. The method of claim 9 in which a single step in the successive generation of reduced transitive effect machine data structures is terminated, and a further successive generation step is commenced, where the classes of a reduced transitive effect machine data structure defined in the single successive generation step are not consistent with the classes in the corresponding assumed reduction component.

13. The method of claim 12 in which the initialization of each assumed reduced component comprises the step of defining each class in the assumed reduced component to include all states in the corresponding component in the state of components.

14. The method of claim 13 in which each step in the successive redefinition of the assumed reduced components comprises defining the classes in each assumed reduced component to be equivalent to the classes in the previously generated corresponding reduced transitive effect machine data structure.

15. A computer program product comprising a computer usable medium tangibly embodying computer readable program code for carrying out the method of claim 14.

16. A computer program product comprising a computer usable medium tangibly embodying computer readable program code for carrying out the method of claim 13.

17. A computer program product comprising a computer usable medium tangibly embodying computer readable program code for carrying out the method of claim 12.

18. The method of claim 9 in which the equivalent effects of transitive interactions for each transition in a component are defined with respect to each of the non-corresponding assumed reduced components.

19. The method of claim 9 in which the equivalent effects of transitive interactions for each transition in the component are defined with respect to defined subsets of the non-corresponding assumed reduced condition.

20. The method of claim 9 in which the equivalent effects of transitive interactions for the corresponding component are merged prior to defining each intermediate reduced transitive effects machine data structure.

21. The method of claim 9 in which the order of generation of intermediate reduced transitive effect machines data structures is an arranged in one or more of the following ways
    i. the generation of intermediate transitive effect machines data structures uses the assumed reduced component corresponding to the most recently defined reduced transitive effect machines data structures;
    ii. a sequential selection of assumed reduced components for use in determining equivalent effects is arranged from the assumed reduced component with fewest classes to the assumed reduced component with most classes; and
    iii. the generation of defined sets of intermediate reduced transitive effect machines data structures is carried out in parallel.

22. The method of claim 9, in which the compositional state system supports labelled transition system models.

23. The method of claim 9, in which equivalent effects of transitive interactions for the transitions in the set of components are defined relative to a one of bisimulation or simulation equivalence.

24. The method of claim 9, in which equivalent effects of transitive interactions for the transitions in the set of components are defined relative to a one of observational equivalence or safety equivalence.

25. The method of claim 9, in which transitive effect machines data structures are represented by BDDs.

26. The method of claim 9, comprising the further step of composing the reduced state representation defined by the set of reduced transitive effect machines data structures.

27. The method of claim 9, comprising the further step of converting the composed reduced state representation to an labelled transition system representation.

28. A computer program product comprising a computer usable medium tangibly embodying computer readable program code for carrying out the method of claim 9.

29. A computer implemented method for generating a test sequence for a system, the system being represented by a model having states and events, the method comprising the following steps:
    i. composing the model and a test representation to generate a composed test model, the test representation comprising states and events defining a set of test requirements, and comprising one or more acceptance events,
    ii. defining a set of transitive effect machine data structures by carrying out the method of claim 1 with respect to the composed test model and a set of events of interest, the set of events of interest comprising one or more of the acceptance events,
    iii. defining an input data set for a test sequence generator using the set of transitive effect machines data structures, and
    iv. obtaining the test sequence by running the test sequence generator on the input data set.

30. A computer program product comprising a computer usable medium tangibly embodying computer readable program code for carying out the method of claim 29.

31. A computer implemented method for generating a test sequence for a system, the system being represented by a model having states and events, the method comprising the following steps:
    i. composing the model and a test representation to generate a composed test model, the test representation comprising states and events defining a set of test requirements, and comprising one or more acceptance events,
    ii. defining a set of transitive effect machine data structures by carrying out the method of claim 8 with respect to the composed test model and a set of events of interest, the set of events of interest comprising one or more of the acceptance events,
    iii. defining an input data set for a test sequence generator using the set of transitive effect machines data structures, and
    iv. obtaining the test sequence by running the test sequence generator on the input data set.

32. A computer program product comprising a computer usable medium tangibly embodying computer readable program code for carrying out the method of claim 31.

33. A computer implemented method for generating a test sequence for a system, the system being represented by a model having states and events, the method comprising the following steps:
    i. defining a set of events of interest,
    ii. composing the model and a test representation to generate a first composed test model, the test representation comprising states and events defining a set of test requirements, and comprising one or more acceptance events,
    iii. defining successive sets of transitive effect machines data structures by carrying out the method of claim 1 with respect to successively defined composed test models and successively defined subsets of the set of events of interest, the said subset comprising one or more of the acceptance events, the successive definition of composed test models comprising the composition of the first test model with the output of a previously defined interim test sequence,
    iv. defining input data sets for a test sequence generator using the successive sets of transitive effect machine data structures,
    v. obtaining a series of interim test sequences by running the test sequence generator on the input data sets, and
    vi. defining the test sequence by running the test sequence generator on the series of interim test sequences.

34. A computer program product comprising a computer usable medium tangibly embodying computer readable program code for carrying out the method of claim 33.

35. A computer implemented method for generating a test sequence for a system, the system being represented by a model having states and events, the method comprising the following steps:
    i. defining a set of events of interest,
    ii. composing the model and a test representation to generate a first composed test model, the test representation comprising states and events defining a set of test requirements, and comprising one or more acceptance events,
    iii. defining successive sets of transitive effect machines data structures by carrying out the method of claim 8 with respect to successively defined composed test models and successively defined subsets of the set of events of interest, the said subset comprising one or more of the acceptance events, the successive definition of composed test models comprising the composition of the first test model with the output of a previously defined interim test sequence, iv. defining input data sets for a test sequence generator using the successive sets of transitive effect machines data structures, v. obtaining a series of interim test sequences by running the test sequence generator on the input data sets, and vi. defining the test sequence by running the test sequence generator on the series of interim test sequences.

36. A computer program product comprising a computer usable medium tangibly embodying computer readable program code for carrying out the method of claim 35.

* * * * *